(12) United States Patent
Ukegawa et al.

(10) Patent No.: US 12,368,083 B2
(45) Date of Patent: Jul. 22, 2025

(54) SEMICONDUCTOR DEVICE

(71) Applicant: DENSO CORPORATION, Kariya (JP)

(72) Inventors: Hiroshi Ukegawa, Toyota (JP);
Takanori Kawashima, Toyota (JP);
Akinori Sakakibara, Toyota (JP)

(73) Assignee: DENSO CORPORATION, Kariya (JP)

( * ) Notice: Subject to any disclaimer, the term of this patent is extended or adjusted under 35 U.S.C. 154(b) by 486 days.

(21) Appl. No.: 17/740,926

(22) Filed: May 10, 2022

(65) Prior Publication Data

US 2022/0270948 A1    Aug. 25, 2022

Related U.S. Application Data

(63) Continuation of application No. PCT/JP2019/044434, filed on Nov. 12, 2019.

(51) Int. Cl.
*H01L 23/367* (2006.01)
*H01L 23/373* (2006.01)

(52) U.S. Cl.
CPC ........ *H01L 23/367* (2013.01); *H01L 23/3735* (2013.01)

(58) Field of Classification Search
CPC .......................... H01L 23/367; H01L 23/3735
See application file for complete search history.

(56) References Cited

U.S. PATENT DOCUMENTS

| 9,543,227 B2 * | 1/2017 | Yoshimura | .......... H01L 23/4006 |
| 2004/0183188 A1 | 9/2004 | Oohama | |
| 2008/0164588 A1 * | 7/2008 | Lee | .......... H01L 24/49 257/668 |
| 2009/0243089 A1 * | 10/2009 | Hohlfeld | ................. H01L 24/32 257/734 |
| 2018/0286778 A1 * | 10/2018 | Spann | ...................... H01L 25/07 |
| 2019/0103340 A1 | 4/2019 | Tsuchimochi | |

FOREIGN PATENT DOCUMENTS

| JP | 2008-041752 A | 2/2008 |
| JP | 2017-034167 A | 2/2017 |

OTHER PUBLICATIONS

U.S. Appl. No. 18/938,667, filed Nov. 6, 2024, Ukegawa et al.

* cited by examiner

*Primary Examiner* — Peniel M Gumedzoe
(74) *Attorney, Agent, or Firm* — Posz Law Group, PLC (57) ABSTRACT

The semiconductor device includes a semiconductor module and a cooler. The semiconductor module includes an insulator substrate, an inner conductor film disposed on a first surface of the insulator substrate, a semiconductor element connected to the inner conductor film, a sealing body sealing the inner conductor film and the semiconductor element, and an outer conductor film disposed on a second surface of the insulator substrate and exposed from a surface of the sealing body. The cooler is disposed adjacent to the outer conductor film via a thermal interface material having fluidity. The outer conductor film has a protruding portion or a recessed portion on a surface being in contact with the thermal interface material.

10 Claims, 5 Drawing Sheets

SEMICONDUCTOR DEVICE

CROSS REFERENCE TO RELATED APPLICATIONS

The present application is a continuation application of International Patent Application No. PCT/JP2019/044434 filed on Nov. 12, 2019, which designated the U.S. The entire disclosure of the above application is incorporated herein by reference.

TECHNICAL FIELD

The present disclosure relates to a semiconductor device.

BACKGROUND

There has been known a semiconductor device including a semiconductor module and a cooler.

SUMMARY

The present disclosure provides a semiconductor device including a semiconductor module and a cooler. The semiconductor module includes an insulator substrate, an inner conductor film disposed on a first surface of the insulator substrate, a semiconductor element connected to the inner conductor film, a sealing body sealing the inner conductor film and the semiconductor element, and an outer conductor film disposed on a second surface of the insulator substrate and exposed from a surface of the sealing body. The cooler is disposed adjacent to the outer conductor film via a thermal interface material having fluidity. The outer conductor film has a protruding portion or a recessed portion on a surface being in contact with the thermal interface material.

BRIEF DESCRIPTION OF DRAWINGS

Objects, features and advantages of the present disclosure will become apparent from the following detailed description made with reference to the accompanying drawings. In the drawings.

DETAILED DESCRIPTION

A semiconductor device includes a semiconductor module and a cooler. The semiconductor module includes an insulator substrate, an inner conductor film, a semiconductor element, a sealing body, and an outer conductor film. The insulator substrate has a first surface and a second surface opposite to each other. The inner conductor film is disposed on the first surface of the insulator substrate. The semiconductor element is connected to the inner conductor film. The sealing body seals the inner conductor film and the semiconductor element. The outer conductor film is disposed on the second surface of the insulator substrate. The outer conductor film is exposed from a surface of the sealing body and the cooler is disposed adjacent to the outer conductor film via a heat dissipating grease.

A thermal interface material (hereinafter, may be simply referred to as TIM) having fluidity, such as the heat dissipating grease, gradually flows over time. Also in the above-described semiconductor device, the heat dissipating grease gradually leaks from between the semiconductor module and the cooler during long-term use. Leakage of the heat dissipation grease may cause deterioration of heat dissipation and poor insulation.

A semiconductor device according to an aspect of the present disclosure includes a semiconductor module and a cooler. The semiconductor module includes an insulator substrate, a inner conductor film, a semiconductor element, a sealing body, and an outer conductor film. The insulator substrate includes a first surface and a second surface opposite to each other. The inner conductor film is disposed on the first surface of the insulator substrate. The semiconductor element is connected to the inner conductor film. The sealing body seals the inner conductor film and the semiconductor element and has a first surface and a second surface opposite to each other. The outer conductor film is disposed on the second surface of the insulator substrate and is exposed from the first surface of the sealing body. The cooler is disposed adjacent to the outer conductor film via a thermal interface material having fluidity. The outer conductor film has a protruding portion or a recessed portion on a surface being in contact with the thermal interface material.

According to the above configuration, the protruding portion or the recessed portion provided on the surface of the outer conductor film can restrict the outward flow of the thermal interface material. As a result, it is possible to suppress the phenomenon that the thermal interface material between the semiconductor module and the cooler leaks to the outside over time.

It should be noted that there is a possibility that the outer conductor film is thermally deformed due to the temperature fluctuation of the semiconductor module. When the outer conductor film is thermally deformed, the size of the protruding portion or the recessed portion provided therein also changes. The change in size that occurs in the protruding portion or the recessed portion may cause leakage of the thermal interface material. In this regard, since the outer conductor film is disposed on the insulator substrate (for example, a ceramic substrate) having a small linear expansion coefficient, the thermal deformation of the outer conductor film is suppressed by the insulator substrate. That is, the change in size that occurs in the protruding portion or the recessed portion is small, and the leakage of the thermal interface material is effectively suppressed.

In one embodiment of the present disclosure, the protruding portion and the recessed portion of the outer conductor film may be located in a range that does not overlap with the semiconductor element in a plan view. According to the above configuration, it is possible to suppress the heat dissipation from the semiconductor element from being obstructed by the protruding portion or the recessed portion. The plan view referred to here means observing the semiconductor device along a direction perpendicular to the insulator substrate.

In one embodiment of the present disclosure, the outer conductor film may have the recessed portion on the surface being in contact with the thermal interface material. In the outer conductor film, the recessed portion is relatively easier to form than the protruding portion.

In the embodiment described above, the recessed portion may include a groove extending in an annular shape along an outer peripheral edge of the outer conductor film. With such a configuration, the leakage of thermal interface material can be effectively suppressed.

In addition to or instead of the above configuration, the recessed portion may include multiple grooves radially extending toward the outer peripheral edge of the outer conductor film. Even with such a configuration, the leakage of the thermal interface material can be effectively suppressed.

In some embodiments, the depth of the groove may be less than the thickness of the outer conductor film. That is, the bottom of the groove may not reach the insulator substrate and may be located in the outer conductor film. According to such a configuration, since the outer conductor film is not divided by the groove, for example, peeling of the outer conductor film from the insulator substrate can be suppressed.

In some embodiments, the width of the groove may gradually decrease along the depth direction. According to such a configuration, the stress generated on an inner surface of the groove is relaxed, so that it is possible to suppress the formation of cracks originating from the groove on the outer conductor film. However, if a side surface of the groove is inclined too much, a crack in the outer conductor film may be induced. Therefore, although not particularly limited, the angle θ formed by the side surface of the groove with respect to the insulator substrate may satisfy $\theta \geq \tan^{-1}(2)=63°$.

In one embodiment of the present disclosure, the outer conductor film may have the protruding portion on the surface being in contact with the thermal interface material. In this case, the protruding portion may include a ridge extending in an annular shape along the outer peripheral edge of the outer conductor film. In addition or instead of the above configuration, the protruding portion may include multiple ridges radially extending toward the outer peripheral edge of the outer conductor film.

In one embodiment of the present disclosure, the thermal interface material may have conductivity. In general, many thermal interface materials having excellent thermal conductivity have conductivity. According to the present disclosure, the leakage of the thermal interface material is suppressed, so that even if the thermal interface material has conductivity, issues such as poor insulation are unlikely to occur. Therefore, thermal interface materials having excellent thermal conductivity can be freely adopted regardless of the presence or absence of conductivity.

In the above-described semiconductor device, the cooler is a first cooler, the insulator substrate is a first insulator substrate, an inner conductor film is a first inner conductor film, the outer conductor film is a first outer conductor film, and the thermal interface material is a first thermal interface material. In one embodiment of the present disclosure, the semiconductor device may further include a second cooler disposed adjacent to the semiconductor module via a second thermal interface material having fluidity. In this case, the semiconductor module may further include a second insulator substrate, a second inner conductor film, and a second outer conductor film. The second insulator substrate faces the first insulator substrate via the semiconductor element and includes a first surface and a second surface opposite to each other. The second inner conductor film is disposed on the first surface of the second insulator substrate, connected to the semiconductor element and sealed by the sealing body. The second outer conductor film is disposed on the second surface of the second insulator substrate and is exposed from the second surface of the sealing body. The second outer conductor film may have a protruding portion or a recessed portion on a surface being in contact with the second thermal interface material. According to such a configuration, the leakage of the second thermal interface material can be suppressed between the second outer conductor film and the second cooler.

A semiconductor device 2 according to an embodiment of the present disclosure will be described with reference to the drawings. The semiconductor device 2 can be adopted in, for example, a power control device for an electric vehicle, and can form a part of a power conversion circuit such as a converter or an inverter. The electric vehicle herein broadly means a vehicle having a motor for driving wheels, and for example, an electric vehicle charged by an external electric power, a hybrid vehicle having an engine in addition to the motor, a fuel cell vehicle having a fuel cell as the power source and the like.

Figure 1:
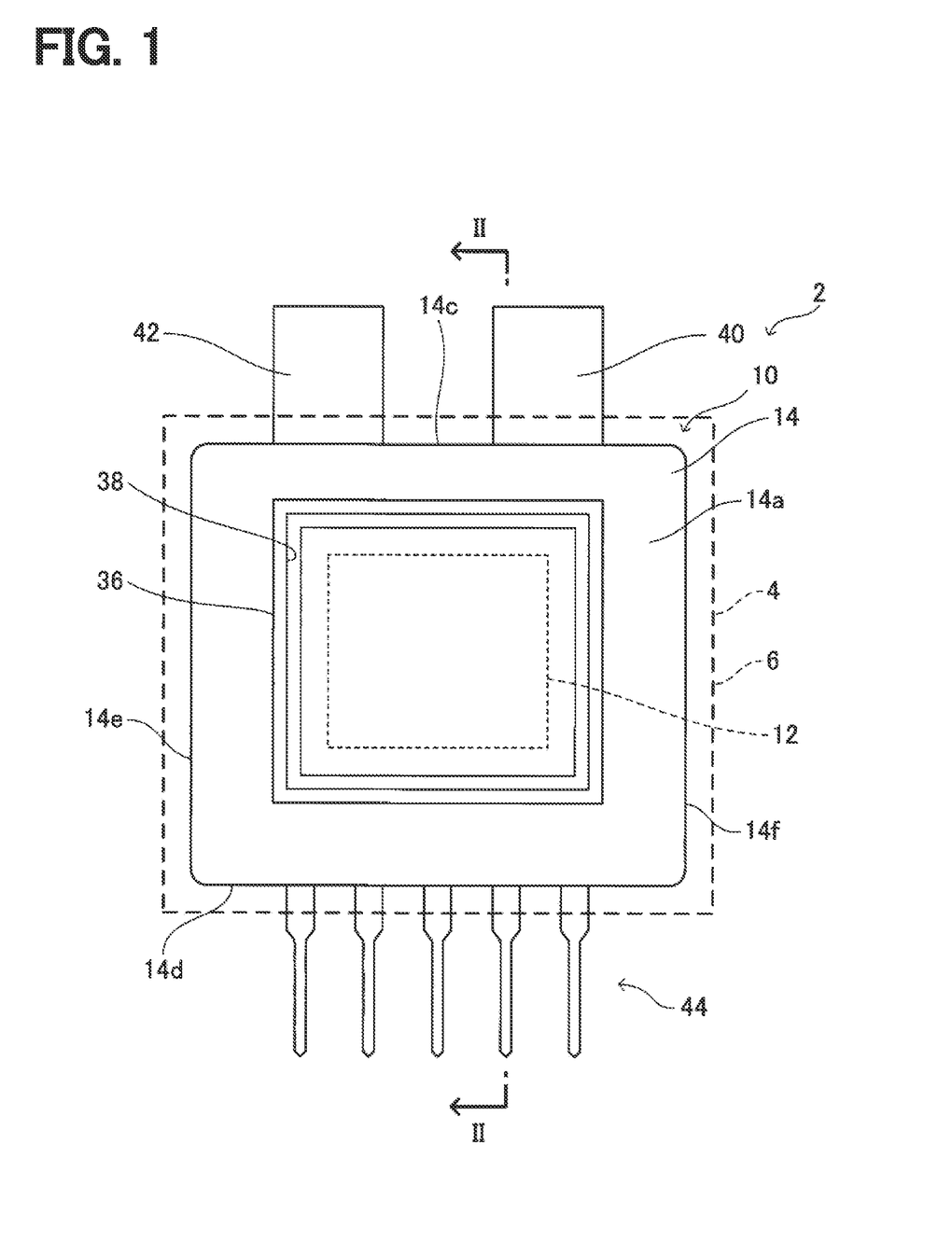
FIG. 1 is a plan view schematically showing a semiconductor device according to an embodiment in which outlines of a first cooler and a second cooler are shown by dashed lines.
Figure 2:
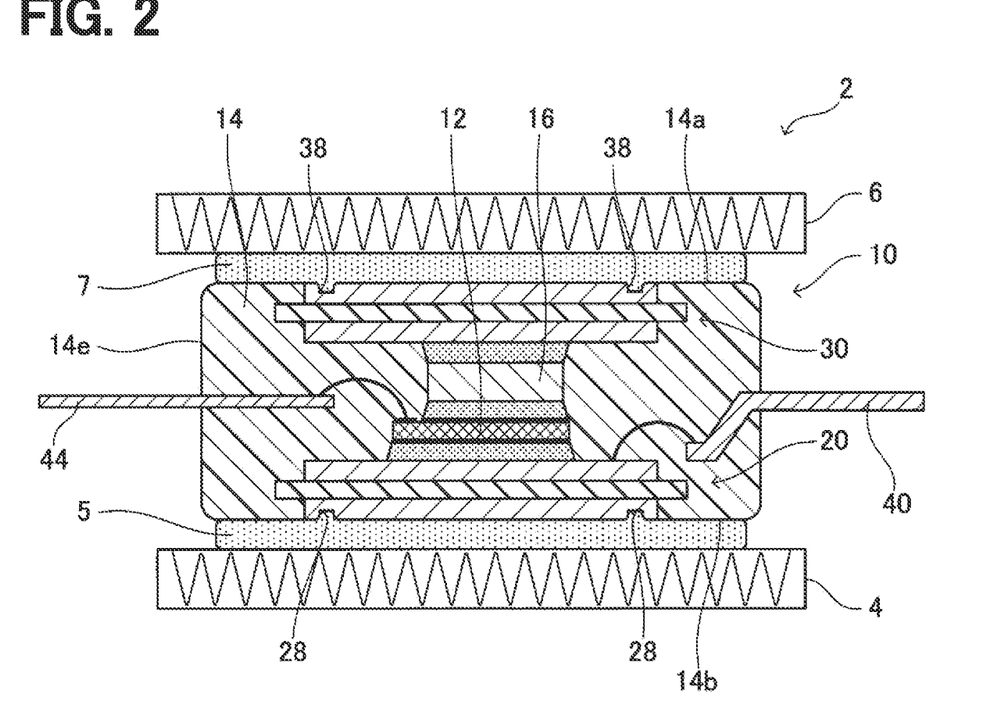
FIG. 2 is a cross-sectional view of the semiconductor device taken along line II-II in FIG. 1.
Figure 3:
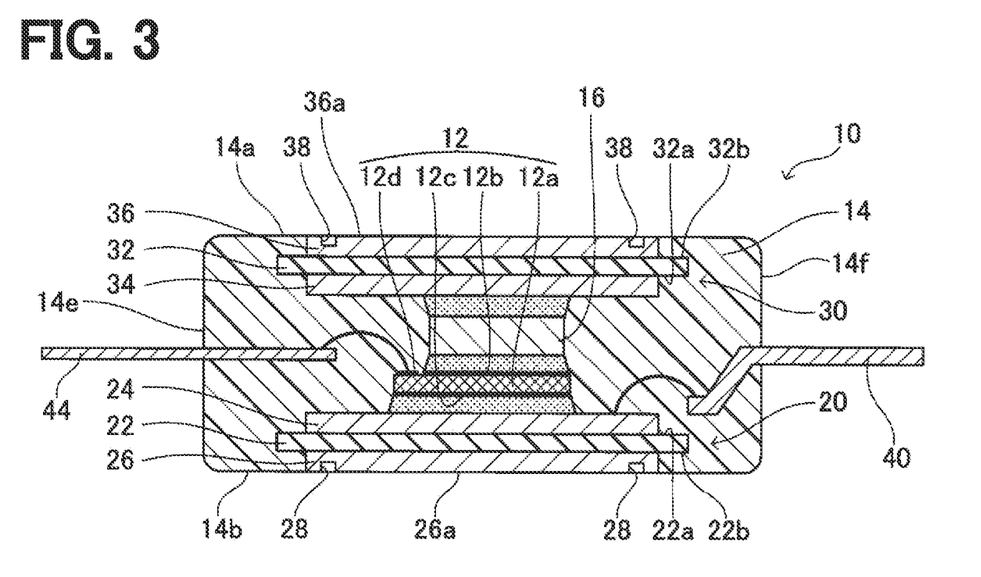
FIG. 3 is a cross-sectional view schematically showing an internal structure of a semiconductor module.

As shown in FIGS. 1, 2, and 3, the semiconductor device 2 includes a semiconductor module 10, a first cooler 4, and a second cooler 6. The first cooler 4 and the second cooler 6 face each other via the semiconductor module 10, and cool the semiconductor module 10. The first cooler 4 is disposed adjacent to the semiconductor module 10 via a heat dissipating grease 5, and the second cooler 6 is disposed adjacent to the semiconductor module 10 via a heat dissipating grease 7. The heat dissipating greases 5 and 7 are examples of first and second thermal interface materials having fluidity (hereinafter referred to as TIM).

The semiconductor module 10 includes a semiconductor element 12 and a sealing body 14 that seals the semiconductor element 12. The sealing body 14 is made of an insulation material. Although not particularly limited, the sealing body 14 in the present embodiment is made of a sealing material such as an epoxy resin. The sealing body 14 generally has a plate shape, and has an upper surface 14a, a lower surface 14b, a first end surface 14c, a second end surface 14d, a first side surface 14e, and a second side surface 14f. The upper surface 14a is located opposite to the lower surface 14b, the first end surface 14c is located opposite to the second end surface 14d, and the first side surface 14e is located opposite to the second side surface 14f.

The semiconductor element 12 is a power semiconductor element and has a semiconductor substrate 12a and multiple electrodes 12b, 12c, and 12d. The multiple electrodes 12b, 12c, 12d include a first main electrode 12b and a second main electrode 12c connected to a power circuit, and multiple signal electrodes 12d connected to a signal circuit. Although not particularly limited, the semiconductor element 12 is a switching element, and can conduct and cut off between the first main electrode 12b and the second main electrode 12c. The first main electrode 12b and the signal electrodes 12d are located on one surface of the semiconductor substrate 12a, and the second main electrode 12c is located on the other surface of the semiconductor substrate 12a.

Although not particularly limited, the semiconductor element 12 in the present embodiment is an RC-IGBT (Reverse-Conducting Insulated Gate Bipolar Transistor), and the semiconductor substrate 12a has an IGBT structure and a diode structure connected in antiparallel to the IGBT structure. The first main electrode 12b is electrically connected to an emitter of the IGBT structure and an anode of the diode structure, and the second main electrode 12c is electrically connected to a collector of the IGBT structure and a cathode of the diode structure. One of the signal electrodes 12d is connected to a gate of the IGBT structure. As another embodiment, the semiconductor element 12 may have a MOSFET (Metal-Oxide-Semiconductor Field-Effect Transistor) structure.

The semiconductor module 10 further includes a first insulated circuit board 20. The first insulated circuit board 20 includes a first insulator substrate 22 made of an insulator, a first inner conductor film 24 disposed on a first surface 22a of the first insulator substrate 22, and a first outer conductor film 26 disposed on a second surface 22b of first insulator substrate 22. Each of the first inner conductor film 24 and the first outer conductor film 26 is made of conductor such as metal. The first inner conductor film 24 is located inside the sealing body 14 and is electrically connected to the semiconductor element 12. Specifically, the second main electrode 12c of the semiconductor element 12 is bonded to the first inner conductor film 24 by soldering.

On the other hand, the first outer conductor film 26 is exposed from the lower surface 14b of the sealing body 14 and faces the first cooler 4 via the heat dissipating grease 5. Accordingly, the first insulated circuit board 20 also functions as a heat sink that dissipates the heat inside the sealing body 14 (particularly, the heat of the semiconductor element 12) to the outside of the sealing body 14. Further, the first outer conductor film 26 has a groove 28 on a surface 26a being in contact with the heat dissipating grease 5. The groove 28 is an example of a recessed portion in the present disclosure. The groove 28 of the first outer conductor film 26 will be described in detail later.

The first insulator substrate 22 in the present embodiment is a ceramic substrate, and is made of ceramic such as aluminum oxide, silicon nitride, and aluminum nitride. The first inner conductor film 24 and the first outer conductor film 26 are metal films, and are made of a metal such as copper or aluminum. In addition, such a circuit board is also referred to as an AMB (Active Metal Brazed Copper) board. However, the first insulated circuit board 20 is not limited to the AMB board, and various circuit boards such as a DBC (Direct Bonded Copper) board and a DBA (Direct Bonded Aluminum) board can also be adopted.

The semiconductor module 10 further includes a second insulated circuit board 30. The second insulated circuit board 30 includes a second insulator substrate 32 made of an insulator, a second inner conductor film 34 disposed on a first surface 32a of the second insulator substrate 32, and a second outer conductor film 36 disposed on a second surface 32b of the second insulator substrate 32. Each of the second inner conductor film 34 and the second outer conductor film 36 is made of conductor such as metal. The second inner conductor film 34 is located inside the sealing body 14 and is electrically connected to the semiconductor element 12. Specifically, the first main electrode 12b of the semiconductor element 12 is bonded to the second inner conductor film 34 via a conductor spacer 16.

On the other hand, the second outer conductor film 36 is exposed from the upper surface 14a of the sealing body 14 and faces the second cooler 6 via the heat dissipating grease 7. Accordingly, the second insulated circuit board 30 also functions as a heat sink that dissipates the heat inside the sealing body 14 (particularly, the heat of the semiconductor element 12) to the outside of the sealing body 14. Further, the second outer conductor film 36a has a groove 38 on a surface 36a being in contact with the heat dissipating grease 7. The groove 38 is an example of a recessed portion in the present disclosure. The groove 38 of the second outer conductor film 36 will also be described later.

Although not particularly limited, the second insulated circuit board 30 in the present embodiment has the same structure as the first insulated circuit board 20. That is, components of the first insulated circuit board 20 and the second insulated circuit board 30 are similar to each other. Therefore, in the description of the second insulated circuit board 30, portions overlapped with the first insulated circuit board 20 are appropriately omitted, but all the technical features and modified examples regarding the first insulated circuit board 20 can be applied to the second insulated circuit board 30. However, as another embodiment, the second insulated circuit board 30 may have a structure different from that of the first insulated circuit board 20 in at least a part thereof. Alternatively, the semiconductor module 10 does not need to include the second insulated circuit board 30, and may include only the first insulated circuit board 20.

The semiconductor module 10 further includes multiple external connection terminals 40, 42, 44. Each of the external connection terminals 40, 42, 44 is made of a conductor such as metal (for example, copper) and extends inside and outside the sealing body 14. The external connection terminals 40, 42, 44 include a first power terminal 40, a second power terminal 42, and multiple signal terminals 44. The first power terminal 40 is electrically connected to the first inner conductor film 24 of the first insulated circuit board 20 inside the sealing body 14. The second power terminal 42 is electrically connected to the second inner conductor film 34 of the second insulated circuit board 30 inside the sealing body 14. As a result, the first power terminal 40 and the second power terminal 42 are connected to each other via the semiconductor element 12, and are electrically connected and disconnected by the operation of the semiconductor element 12. The signal terminals 44 are respectively connected to the signal electrodes 12d of the semiconductor element 12 inside the sealing body 14.

As described above, in the semiconductor device 2 of the present embodiment, the coolers 4 and 6 are disposed on both sides of the semiconductor module 10 via the heat dissipating greases 5 and 7. The TIM having fluidity such as the heat dissipating greases 5 and 7 gradually flows over time due to, for example, the influence of repeated thermal deformation of the semiconductor module 10. Therefore, even in the semiconductor device 2 of the present embodiment, the heat dissipating greases 5 and 7 may gradually leak from between the semiconductor module 10 and the coolers 4 and 6. Leakage of the heat dissipating greases 5 and 7 not only causes a decrease in heat dissipation, but also may cause issues such as poor insulation by adhering to the external connection terminals 40, 42 and 44.

With respect to the above issues, in the semiconductor device 2 of the present embodiment, the first outer conductor film 26 of the semiconductor module 10 has the groove 28 on the surface 26a being in contact with the heat dissipating grease 5. In this way, when the surface 26a of the first outer conductor film 26 in contact with the heat dissipating grease 5 has a recessed portion such as the groove 28, the heat dissipating grease 5 is held by the recessed portion, and the outward flow of the heat dissipating grease 5 is suppressed. As a result, it is possible to suppress the phenomenon that the heat dissipating grease 5 between the semiconductor module 10 and the first cooler 4 leaks to the outside over time.

Similarly, the second outer conductor film 36 adjacent to the second cooler 6 has the groove 38 on the surface 36a being in contact with the heat dissipating grease 7. In this way, when the surface 36a of the second outer conductor film 36 in contact with the heat dissipating grease 7 is has a recessed portion such as the groove 38, the heat dissipating grease 7 is held by the recessed portion, and the outward flow of the heat dissipating grease 7 is suppressed. As a result, the phenomenon that the heat dissipating grease 7 leaks to the outside over time is suppressed even between the semiconductor module 10 and the second cooler 6.

Thermal deformation (expansion and contraction) may occur in the first outer conductor film 26 with the temperature fluctuation of the semiconductor module 10. When the first outer conductor film 26 is thermally deformed, the size (that is, the cross-sectional area) of the groove 28 provided therein also changes. When the size of the groove 28 changes, the heat dissipating grease 5 moves in and out of the groove 28, which may promote leakage of the heat dissipating grease 5. In this regard, since the first outer conductor film 26 is disposed on the first insulator substrate 22 (for example, a ceramic substrate) having a small linear expansion coefficient, the thermal deformation of the first outer conductor film 26 is suppressed by the first insulator substrate 22. That is, the change in size that occurs in the groove 28 is small, and the leakage of the heat dissipating grease 5 is effectively suppressed.

Figure 4:
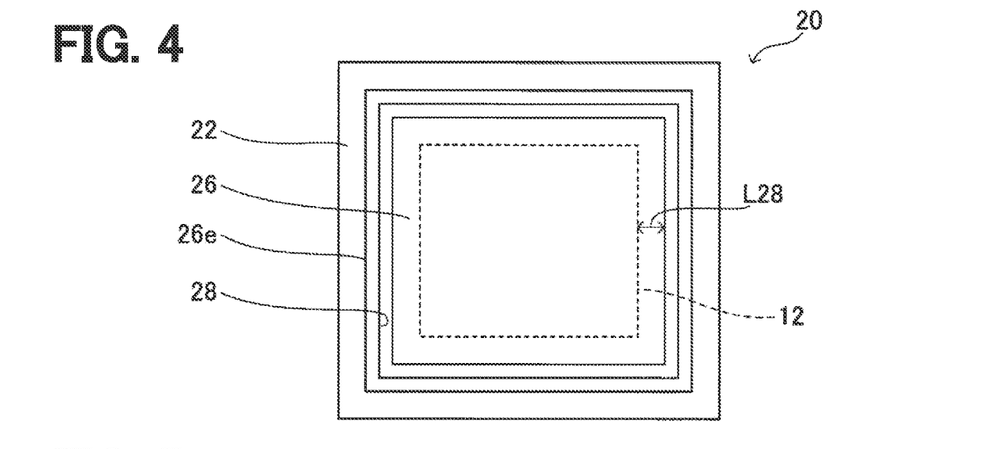
FIG. 4 is a plan view schematically showing a first insulated circuit board, and in particular, shows a first outer conductor film and a groove thereof.
Figure 5:
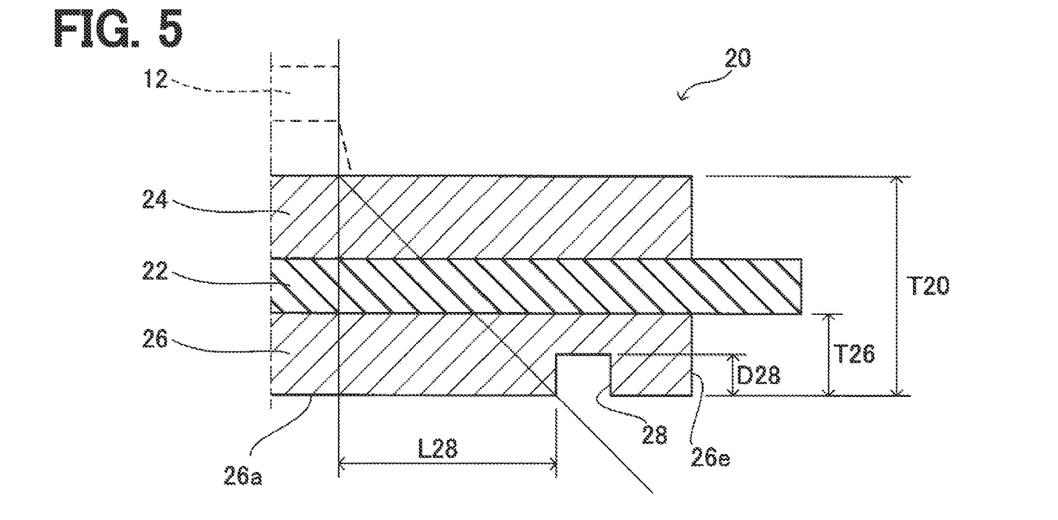
FIG. 5 is a cross-sectional view showing a cross-sectional shape of the groove of the first outer conductor film.

In the semiconductor device 2 of the present embodiment, the specific configurations of the grooves 28 and 38 are not particularly limited. As an example, the groove 28 of the first outer conductor film 26 in the present embodiment will be described with reference to FIGS. 4 and 5. The groove 28 extends in an annular shape along an outer peripheral edge 26e of the first outer conductor film 26. That is, the groove 28 extends in an intersecting direction with respect to the outward flow of the heat dissipating grease 5. The depth D28 of the groove 28 is smaller than the thickness T26 of the first outer conductor film 26 and the groove 28 does not reach the first insulator substrate 22. According to such a configuration, since the first outer conductor film 26 is not divided by the groove 28, for example, peeling of the first outer conductor film 26 from the first insulator substrate 22 can be suppressed. Although not particularly limited, the depth D28 of the groove 28 may be half or less of the thickness T26 of the first outer conductor film 26 (that is, D28≤T26/2). The groove 28 is located in a range that does not overlap with the semiconductor element 12 in a plan view (FIG. 4). The plan view referred to here means observing the semiconductor device 2 along a direction perpendicular to the first insulator substrate 22. Accordingly, it is possible to restrict the heat dissipation from the semiconductor element 12 from being obstructed by the groove 28. In this case, although not particularly limited, the distance L28 from the semiconductor element 12 to the groove 28 in the plan view may be set to be equal to or more than the thickness T20 (that is, L28≥T20) of the first insulated circuit board 20.

Figure 6:
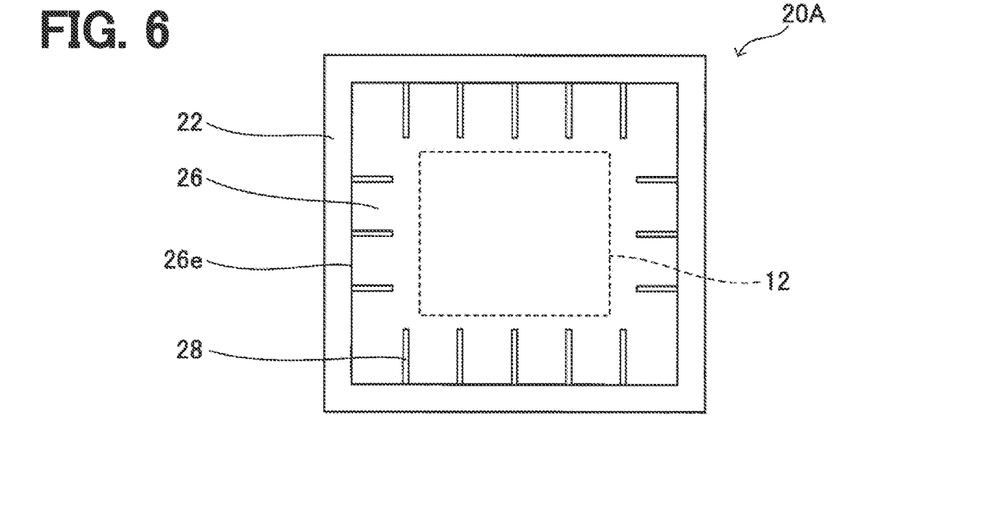
FIG. 6 is a plan view schematically showing a first insulated circuit board according to a modified example.

FIG. 6 shows a first insulated circuit board 20A according to a modified example. In the first insulated circuit board 20A of the present modified example, multiple grooves 28 are provided on the surface 26a of the first outer conductor film 26. The grooves 28 radially extend toward the outer peripheral edge 26e of the first outer conductor film 26. Also in the present modified example, since the surface 26a of the first outer conductor film 26 in contact with the heat dissipating grease 5 is provided with recessed portions such as the grooves 28, and the recessed portions hold the head dissipating grease 5, the outward flow of the heat dissipating grease 5 is obstructed. Therefore, it is possible to suppress the phenomenon that the heat dissipating grease 5 between the semiconductor module 10 and the first cooler 4 leaks to the outside over time.

Figure 7:
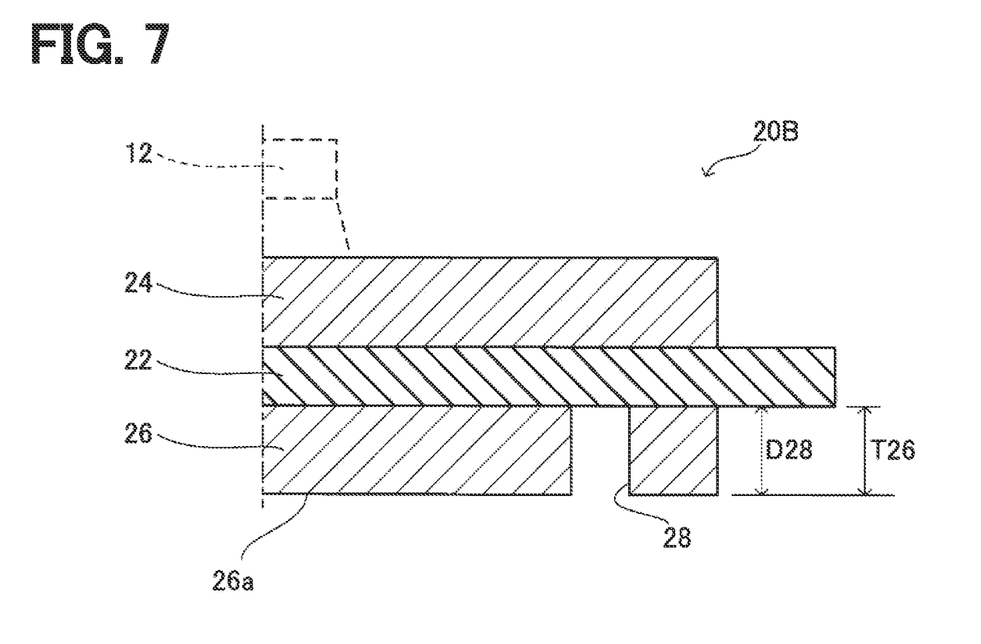
FIG. 7 is a cross-sectional view schematically showing a first insulated circuit board according to another modified example.

FIG. 7 shows a first insulated circuit board 20B according to another modified example. In the first insulated circuit board 20B of the present modified example, the groove 28 of the first outer conductor film 26 has such a depth D28 that the groove 28 reaches the first insulator substrate 22. That is, the depth D28 of the groove 28 is equal to the thickness T26 of the first outer conductor film 26. As described above, the depth D28 of the groove 28 can be designed with various dimensions without particular limitation. The first outer conductor film 26 may have a recessed portion having another shape such as a hole without limited to the groove 28. The number and shape of the recessed portion provided in the first outer conductor film 26 are not particularly limited.

Figure 8:
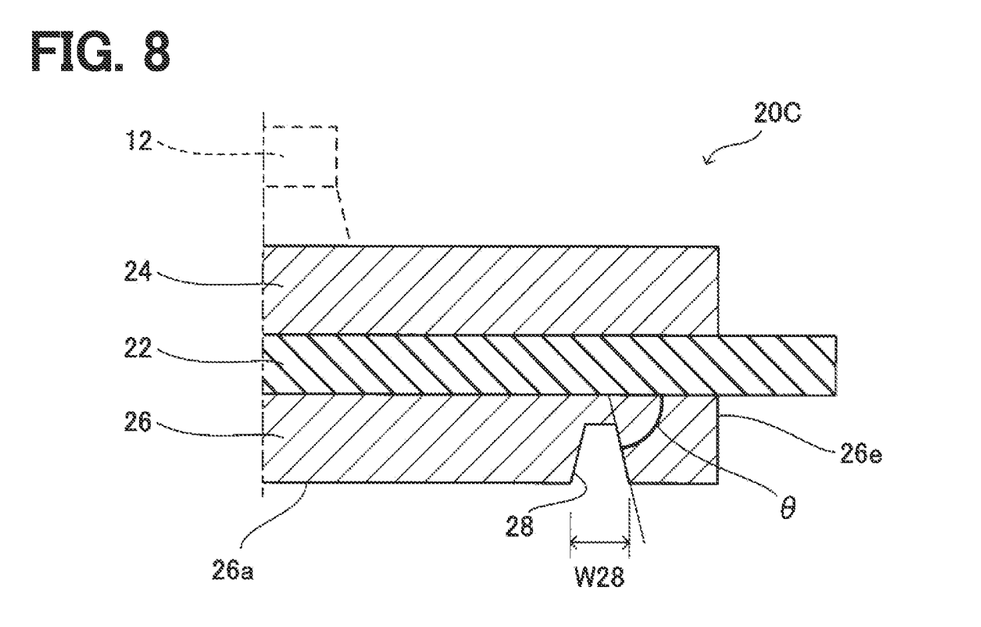
FIG. 8 is a cross-sectional view schematically showing a first insulated circuit board according to another modified example.

FIG. 8 shows a first insulated circuit board 20C according to another modified example. In the first insulated circuit board 20C of the present modified example, the groove 28 of the first outer conductor film 26 has a tapered cross section. Specifically, the width W28 of the groove 28 gradually decreases along the depth direction, that is, toward the first insulator substrate 22. According to such a configuration, the stress generated on the inner surface of the groove 28 is relaxed, so that it is possible to suppress the formation of cracks originating from the groove 28 on the first outer conductor film 26. However, if a side surface of the groove 28 is inclined too much, a crack in the first outer conductor film 26 may be induced. Therefore, although not particularly limited, the angle θ formed by the side surface of the groove with respect to the first insulator substrate 22 may satisfy $\theta \geq \tan^{-1}(2) = 63°$.

Figure 9:
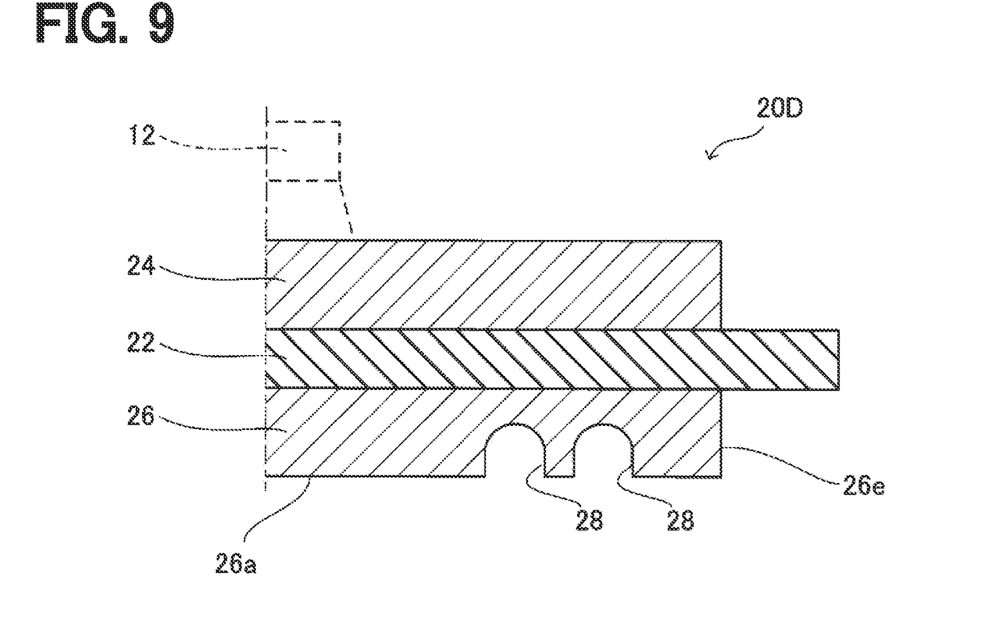
FIG. 9 is a cross-sectional view schematically showing a first insulated circuit board according to another modified example.

FIG. 9 shows a first insulated circuit board 20D according to another modified example. In the first insulated circuit board 20D of the present modified example, the first outer conductor film 26 has two grooves 28. The two grooves 28 are adjacent to each other and extend in annular shapes along the outer peripheral edge 26e of the first outer conductor film 26. In this way, the first outer conductor film 26 may have two or more grooves 28 extending in annular shapes. Further, although not particularly limited, the inner surface of each of the grooves 28 may have a curved surface, whereby the stress generated on the inner surface of each of the grooves 28 is relaxed. The grooves 28 having the above structure can be easily formed by, for example, wet etching. The two or more grooves 28 may have the same cross-sectional shape as each other, or may have different cross-sectional shapes from each other.

Figure 10:
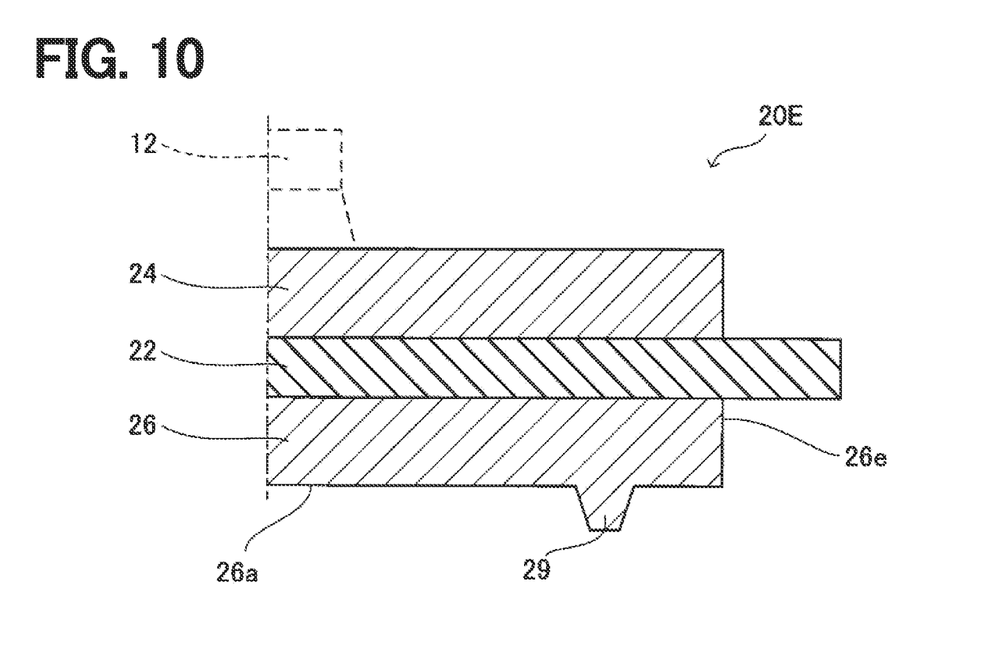
FIG. 10 is a cross-sectional view schematically showing a first insulated circuit board according to another modified example.

FIG. 10 shows a first insulated circuit board 20E according to another modified example. In the first insulated circuit board 20E of the present modified example, the first outer conductor film 26 has a ridge 29 on the surface 26a instead of the groove 28. Even when the surface 26a of the first outer conductor film 26 in contact with the heat dissipating grease 5 is provided with a protruding portion such as the ridge 29, the flow of the heat dissipating grease 5 toward the outside is obstructed by the ridge 29. As a result, it is possible to suppress the phenomenon that the heat dissipating grease 5 between the semiconductor module 10 and the first cooler 4 leaks to the outside over time. Here, the specific configuration of the protruding portion such as the ridge 29 is not particularly limited. As an example, the ridge 29 in the present modified example extends in an annular shape along the outer peripheral edge 26e of the first outer conductor film 26. However, as another modified example, the surface 26a of the first outer conductor film 26 may be provided with multiple protruding portions radially extending toward the outer peripheral edge 26e of the first outer conductor film 26. The number and shape of the protruding portions are not particularly limited.

As described above, all of the technical features and modified examples relating to the first insulated circuit board 20 can be similarly applied to the second insulated circuit board 30 alone or in any combination. For example, the technical contents according to the modified examples shown in FIGS. 6 to 10 can be similarly adopted in the second insulated circuit board 30 in addition to or instead of the first insulated circuit board 20.

Although specific examples of the techniques disclosed in the present specification have been described in detail above, these are merely examples and do not limit the scope of claims. The techniques described in the claims include various modified examples and modified examples of the specific examples illustrated above. The technical elements described in the present specification or the drawings exhibit technical usefulness alone or in various combinations, and are not limited to the combinations described in the claims at the time of filing. The techniques illustrated in the present specification or drawings can achieve multiple objectives at the same time, and achieving one of the objectives itself has technical usefulness.

What is claimed is:

1. A semiconductor device comprising:
   a semiconductor module including
      an insulator substrate having a first surface and a second surface opposite to each other,
      an inner conductor film disposed on the first surface of the insulator substrate,
      a semiconductor element connected to the inner conductor film,
      a sealing body sealing the inner conductor film and the semiconductor element and having a first surface and a second surface opposite to each other, and
      an outer conductor film disposed on the second surface of the insulator substrate and is exposed from the first surface of the sealing body; and
   a cooler disposed adjacent to the outer conductor film via a thermal interface material having fluidity, wherein
   the outer conductor film has a recessed portion on a surface being in contact with the thermal interface material,
   the recessed portion includes a groove extending continuously in an annular shape along an entirety of an outer peripheral edge of the outer conductor film,
   a depth of the groove is smaller than a thickness of the outer conductor film,
   the groove is located in a range that does not overlap with the semiconductor element in a plan view, and
   a distance from the semiconductor element to the groove in the plan view is greater than or equal to a thickness of the inner conductor film, the insulator substrate, and the outer conductor film combined.

2. The semiconductor device according to claim 1, wherein
   a width of the groove gradually decreases along a depth direction.

3. The semiconductor device according to claim 1, wherein
   the thermal interface material has conductivity.

4. The semiconductor device according to claim 1, wherein
   the insulator substrate is a first insulator substrate, the inner conductor film is a first inner conductor film, the outer conductor film is a first outer conductor film, and the cooler is a first cooler,
   the semiconductor device further comprises a second cooler disposed adjacent to the semiconductor module via a second thermal interface material having fluidity,
   the semiconductor module further includes
      a second insulator substrate facing the first insulator substrate via the semiconductor element and having a first surface and a second surface opposite to each other,
      a second inner conductor film disposed on the first surface of the second insulator substrate, connected to the semiconductor element, and sealed by the sealing body, and
      a second outer conductor film disposed on the second surface of the second insulator substrate and exposed from the second surface of the sealing body, and
   the second outer conductor film has a protruding portion or a recessed portion on a surface being in contact with the second thermal interface material.

5. The semiconductor device according to claim 1, wherein
   the insulator substrate is a ceramic substrate and has a smaller linear expansion coefficient than the outer conductor film.

6. The semiconductor device according to claim 1, wherein
   the depth of the groove is half or less of the thickness of the outer conductor film.

7. A semiconductor device comprising:
   a semiconductor module including
      an insulator substrate having a first surface and a second surface opposite to each other,
      an inner conductor film disposed on the first surface of the insulator substrate,
      a semiconductor element connected to the inner conductor film,
      a sealing body sealing the inner conductor film and the semiconductor element and having a first surface and a second surface opposite to each other, and
      an outer conductor film disposed on the second surface of the insulator substrate and is exposed from the first surface of the sealing body; and
   a cooler disposed adjacent to the outer conductor film via a thermal interface material having fluidity, wherein
   the outer conductor film has a flat portion and at least one protruding portion on a surface of the outer conductor film being in contact with the thermal interface material,
   the flat portion occupies most of the surface of the outer conductor film being in contact with the thermal interface material, and the at least one protruding portion protrudes from the flat portion toward the thermal interface material.

8. The semiconductor device according to claim 7, wherein
the at least one protruding portion is located in a range that does not overlap with the semiconductor element in a plan view.

9. The semiconductor device according to claim 7, wherein
the at least one protruding portion extends in an annular shape along an outer peripheral edge of the outer conductor film.

10. The semiconductor device according to claim 7, wherein
the at least one protruding portion includes a plurality of protruding portions radially extending toward an outer peripheral edge of the outer conductor film.

* * * * *